(12) United States Patent
Huh

(10) Patent No.: US 8,395,940 B2
(45) Date of Patent: Mar. 12, 2013

(54) PAGE BUFFER CIRCUIT, NONVOLATILE MEMORY DEVICE INCLUDING THE PAGE BUFFER CIRCUIT, AND METHOD OF OPERATING THE NONVOLATILE MEMORY DEVICE

(75) Inventor: Hwang Huh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 310 days.

(21) Appl. No.: 12/780,140

(22) Filed: May 14, 2010

(65) Prior Publication Data

US 2010/0309725 A1    Dec. 9, 2010

(30) Foreign Application Priority Data

Jun. 8, 2009    (KR) ................. 10-2009-0050437

(51) Int. Cl.
*G11C 16/04*    (2006.01)
(52) U.S. Cl. .......... 365/185.12; 365/185.25; 365/189.05
(58) Field of Classification Search ............. 365/189.05, 365/185.03, 185.18, 185.11, 230.06, 230.08
See application file for complete search history.

(56) References Cited

U.S. PATENT DOCUMENTS

| | | | | |
|---|---|---|---|---|
| 7,200,044 B2* | 4/2007 | Won et al. ................. | 365/185.22 |
| 7,457,157 B2* | 11/2008 | Kim ......................... | 365/185.03 |
| 7,564,724 B2* | 7/2009 | Park ........................ | 365/189.05 |
| 7,639,544 B2* | 12/2009 | Hosono et al. ........... | 365/185.21 |
| 8,179,727 B2* | 5/2012 | Kim ......................... | 365/185.24 |
| 2007/0014163 A1* | 1/2007 | Kim ......................... | 365/189.12 |

FOREIGN PATENT DOCUMENTS

KR    1020070015777    2/2007

OTHER PUBLICATIONS

Notice of Allowance issued from Korean Intellectual Property Office on Jul. 1, 2011.

* cited by examiner

*Primary Examiner* — Gene Auduong
(74) *Attorney, Agent, or Firm* — IP & T Group LLP

(57) ABSTRACT

A page buffer circuit including a bit line selection unit configured to select the first or second bit line in response to a first control signal and couple the selected bit line to a sense node, or to selectively precharge or discharge the first and second bit lines to a first voltage level, a first latch unit configured to store program data and output the stored program data to the sense node, a second latch unit configured to store data of a low logic level in response to a reset signal and discharge a selected bit line from a precharge state to a second voltage level, and a voltage control element configured to raise a voltage level of the sense node or drop a voltage level of the sense node to a third voltage level in response to a second control signal.

20 Claims, 6 Drawing Sheets

PAGE BUFFER CIRCUIT, NONVOLATILE MEMORY DEVICE INCLUDING THE PAGE BUFFER CIRCUIT, AND METHOD OF OPERATING THE NONVOLATILE MEMORY DEVICE

CROSS-REFERENCE TO RELATED APPLICATION

Priority to Korean patent application number 10-2009-0050437 filed on Jun. 8, 2009, the entire disclosure of which is incorporated by reference herein, is claimed.

BACKGROUND

Exemplary embodiments relate to a nonvolatile memory device and, more particularly, to a page buffer circuit, a nonvolatile memory device including the page buffer circuit, and a method of operating the nonvolatile memory device, which are capable of reducing a peak current according to the recovery of a bit line voltage by controlling the bit line voltage.

There is an increasing demand for semiconductor memory devices which can be electrically programmed and erased and can retain data even without the supply of power. To develop high-capacity memory devices capable of storing a large amount of data, technology for high-integrated memory cells is being developed. To this end, there was proposed a NAND type flash memory device in which a plurality of memory cells is coupled in series to form a string and a plurality of strings constitutes a memory cell array.

Each of the flash memory cells of the NAND type flash memory device includes a current path, formed between the source and the drain over a semiconductor substrate, and a floating gate and a control gate, formed between insulating layers over the semiconductor substrate. Furthermore, the program operation of the memory cell is mainly performed by grounding the source/drain regions of the memory cell and the semiconductor substrate (i.e., a bulk region) and supplying a high positive voltage to the control gate so that Fowler-Nordheim (F-N) tunneling is generated between the floating gate and the semiconductor substrate. Through such F-N tunneling, an electric field of the high voltage supplied to the control gate causes the electrons of the bulk region to be accumulated in the floating gate, thereby raising a threshold voltage of the memory cell.

Recently, to further increase the degree of integration of the flash memory cells, active research is being carried out on a multi-bit cell which is able to store plural data in one memory cell. This type of a memory cell is mainly referred to as a multi-level cell (MLC). A memory cell capable of storing a single bit is referred to as a single level cell (SLC).

FIG. 1A is a diagram showing a state in which a memory cell array and a page buffer are interconnected.

FIG. 1A illustrates a nonvolatile memory device, including a page buffer 120 and memory cells coupled to a pair of bit lines included in a memory cell array 110.

The pair of bit lines include an even bit line BLe and an odd bit line BLo. A cell string is coupled to each of the bit lines.

Each cell string includes a plurality of memory cells coupled in series between a drain select transistor and a source select transistor.

The gates of the memory cells are respectively coupled to $0^{th}$ to thirty-first word lines WL<0> to WL<31>. A drain selection line DSL is coupled to the gates of the drain select transistors of each of the cell strings, and a source selection line SSL is coupled to the gates of the source select transistors of each of the cell strings. The sources of the source select transistors are coupled to a global source line GL.

The page buffer unit 120 includes a bit line selection unit 121, a sense unit 122, a precharge unit 123, and a plurality of latch units 124.

The bit line selection unit 121 couples the sense unit 122 and a bit line which is selected when a program or read operation is performed. The bit line selection unit 121 precharges or discharges the selected bit line.

The sense unit 122 senses voltage of a bit line coupled thereto and changes the voltage level of a sense node SO. The precharge unit 123 precharges the sense node SO. The plurality of latch units 124 transfer program data to the sense node SO or latch data according to the voltage level of the sense node SO.

The bit line selection unit 121 selects the even bit line BLe or the odd bit line no. A variable voltage VIRPWR for precharging or discharging a selected bit line is supplied to the bit line selection unit 121. The variable voltage VIRPWR is generated by a variable voltage generator (not shown). The variable voltage generator generates and supplies the variable voltage VIRPWR in order to recover a voltage drop when voltage of a precharged bit line drops.

FIG. 1B is a circuit diagram of the variable voltage generator for supplying the variable voltage shown in FIG. 1A.

Referring to FIG. 1B, the variable voltage generator 125 includes a comparator COM and first to third PMOS transistors MP1 to MP3.

The comparator COM has an inverting terminal (−) to which a reference variable voltage VIRPWR_REF is inputted. The first to third PMOS transistors MP1 to MP3 are coupled in series between a power source voltage Vcc and a ground node Vss. The gate of the second PMOS transistor MP2 is coupled to the non-inverting terminal (+) of the comparator COM.

The variable voltage VIRPWR is outputted from a node of the first PMOS transistor MP1 and the second PMOS transistor MP2.

A process of setting the voltage of a bit line when a program operation is performed is described below with reference to FIGS. 1A and 1B.

To perform a program operation, the even and odd bit lines BLe, BLo are precharged by the variable voltage VIRPWR.

In the case in which the even bit line BLe is selected, the even bit line BLe is maintained at the precharge state or discharged in response to a data state of one of the latch units 124 in which program data are stored.

In the case in which the even bit line BLe is discharged, the voltage level of the odd bit line BLo drops because of a coupling effect. Thus, a peak current is generated due to such a sudden voltage drop. The variable voltage generator 125 performs a recovery operation for sensing the voltage drop of the odd bit line BLo and recovering the voltage level of the odd bit line BLo.

In the structure in which a program operation is alternately performed on the even bit line BLe and the odd bit line BLo, problems, such as a voltage drop and a peak current, are inevitably generated because of a change in the voltage of a selected bit line occurring in response to a state of program data.

BRIEF SUMMARY

Exemplary embodiments relate to a page buffer circuit, a nonvolatile memory device including the page buffer circuit, and a method of operating the nonvolatile memory device, wherein a precharged bit line is stepwise discharged in response to a state of program data.

A page buffer circuit according to an aspect of the present disclosure includes a bit line selection unit coupled to first and second bit lines, and configured to select the first or second bit line in response to a first control signal and to couple the selected bit line to a sense node, or to selectively precharge or discharge the first and second bit lines to a first voltage level, a first latch unit configured to store program data and output the stored program data to the sense node, a second latch unit configured to store data of a low logic level in response to a reset signal and discharge a selected bit line from a precharge state to a second voltage level, and a voltage control element configured to raise a voltage level of the sense node or drop a voltage level of the sense node to a third voltage level in response to a second control signal.

The data stored in the second latch unit may have a voltage level equal to the second voltage level, which is higher than a ground voltage level.

The voltage control element may include a transistor having a gate coupled to the sense node and a drain and a source interconnected. The second control signal may also be inputted to the transistor.

The second latch unit may include a first inverter configured to invert a signal of a first node and output an inverted signal to a second node, a first element configured to raise an output of the first inverter to a certain voltage level when the output of the first inverter is in a low logic level state, a second inverter configured to invert a signal of the second node and output an inverted signal to the first node, and a second element configured to raise an output of the second inverter to a constant voltage level when the output of the second inverter is in a low logic level state.

Each of the first and second elements may include a diode.

Or each of the first and second elements may include a resistor.

In the case in which the data stored in the second latch unit are transferred to the first latch unit, the sense node is precharged so that the voltage level of the sense node is changed in response to a state of the data stored in the second latch unit, the voltage level of the sense node is changed using the voltage control element, and the data stored in the second latch unit are stored in the first latch unit.

In the case in which the data stored in the second latch unit are transferred to the first latch unit, the voltage control element may drop the voltage level of the sense node to the third voltage level.

A nonvolatile memory device according to another aspect of the present disclosure includes a memory cell array configured to include memory blocks each including memory cells coupled to bit lines and word lines, and a page buffer unit coupled to the bit lines and configured to include page buffers each including a first latch and a second latch, wherein the first latch latches program data to be programmed into a memory cell or stores read data read from a memory cell, and the second latch discharges a precharged bit line, having a first voltage level, when data stored in the second latch have a low logic level state.

Each of the page buffers may further include a bit line selection unit coupled to first and second bit lines from among the bit lines of the memory cell array, and configured to select the first or second bit line in response to a first control signal and to couple the selected bit line to a sense node, or to selectively precharge or discharge the first and second bit lines to the first voltage level using a variable voltage, a first latch unit configured to store the program data in the first latch and to supply the stored program data to the sense node, a second latch unit configured to latch the program data in the second latch, to supply the latched program data to the sense node, and to discharge the selected bit line from a precharged state to a second voltage level, and a voltage control element configured to raise the voltage level of the sense node or drop the voltage level of the sense node to a third voltage level in response to a second control signal.

The data stored in the second latch may have a level equal to the second voltage level, which is higher than a ground voltage level.

The voltage control element may include a transistor having a gate coupled to the sense node and a drain and a source interconnected. The second control signal may also be inputted to the transistor.

The second latch unit may include a first inverter configured to invert a signal of a first node and output an inverted signal to a second node, a first element configured to raise an output of the first inverter to a certain voltage level when the output of the first inverter is in a low logic level state, a second inverter configured to invert a signal of the second node and output an inverted signal to the first node, and a second element configured to raise an output of the second inverter to a constant voltage level when the output of the second inverter is in a low logic level state.

Each of the first and second elements may include a diode.

Each of the first and second elements may include a resistor.

In the case in which the data stored in the second latch unit are transferred to the first latch unit, the sense node is precharged so that the voltage level of the sense node is changed in response to a state of the data stored in the second latch unit, the voltage level of the sense node is changed using the voltage control element, and the data stored in the second latch unit are stored in the first latch unit.

In the case in which the data stored in the second latch unit are transferred to the first latch unit, the voltage control element may drop the voltage level of the sense node to the third voltage level.

A method of operating a nonvolatile memory device, including a page buffer coupled to first and second bit lines and configured to comprise first and second latches, wherein the first latch is coupled to a sense node and is configured to store program data and the second latch is coupled to the sense node and is configured to discharge a precharged bit line, having a first voltage level, when data stored in the second latch have a low logic level state, according to yet another aspect of the present disclosure includes selecting one of the first and second bit lines, precharging the selected bit line to the first voltage level, coupling the selected bit line to the second latch and discharging the selected bit line to a second voltage level, discharging the selected bit line to a ground voltage level or maintaining the selected bit line at the second voltage level, in response to a state of data stored in the first latch, and performing a program operation in response to a program pulse.

When performing the program operation in response to the program pulse, if the selected bit line is maintained at the second voltage level, the program operation for the selected bit line is inhibited.

The method may further include performing a program verification operation after performing the program operation. In the case in which data stored in the second latch are transferred to the first latch, performing the program verification operation may include precharging the sense node and changing the voltage level of the sense node in response to a state of the data stored in the second latch, dropping the voltage level of the sense node to a certain voltage level, and storing data based on the dropped voltage level of the sense node in the first latch.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1A:
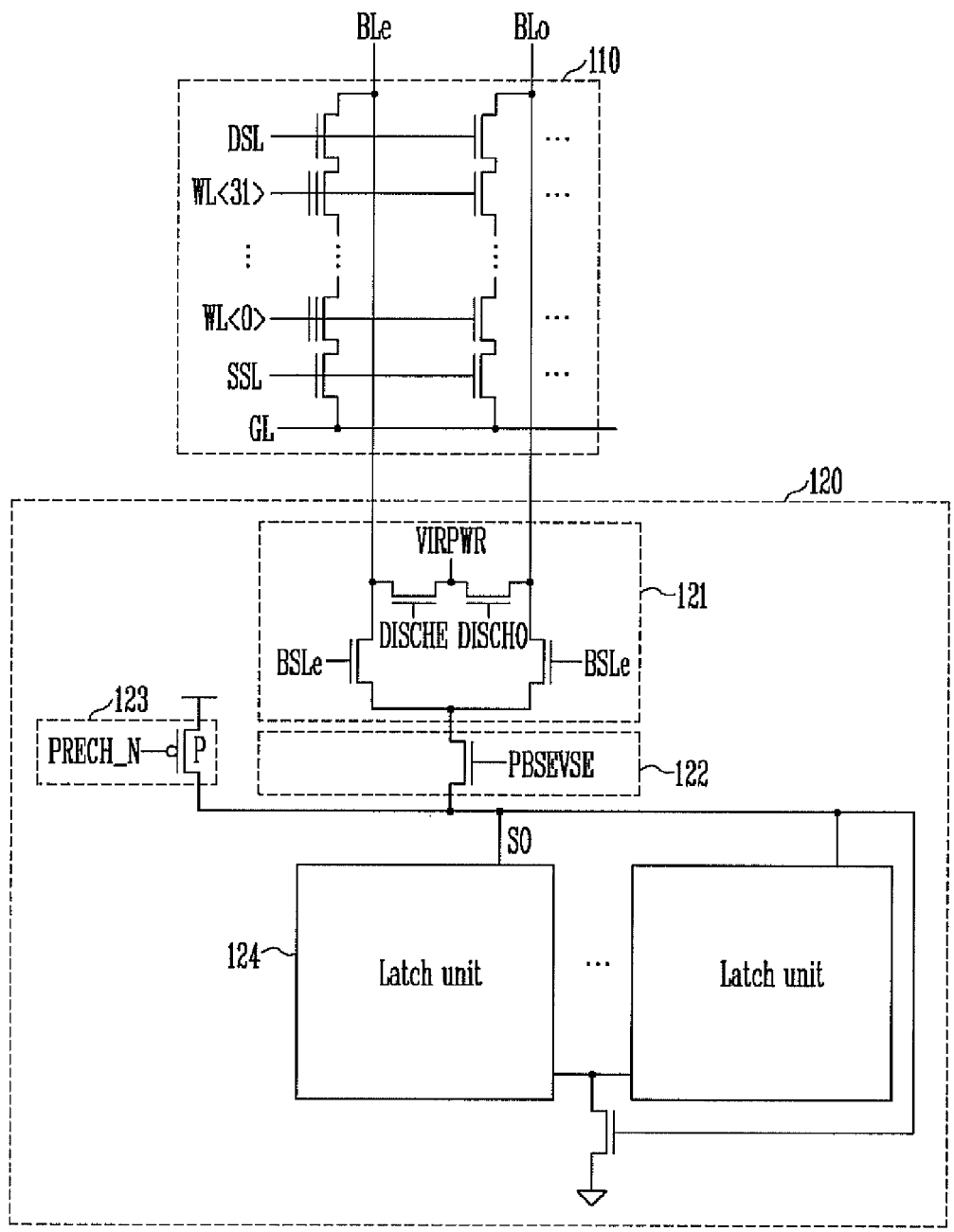
FIG. 1A is a diagram showing a state in which a memory cell array and a page buffer are interconnected.
Figure 1B:
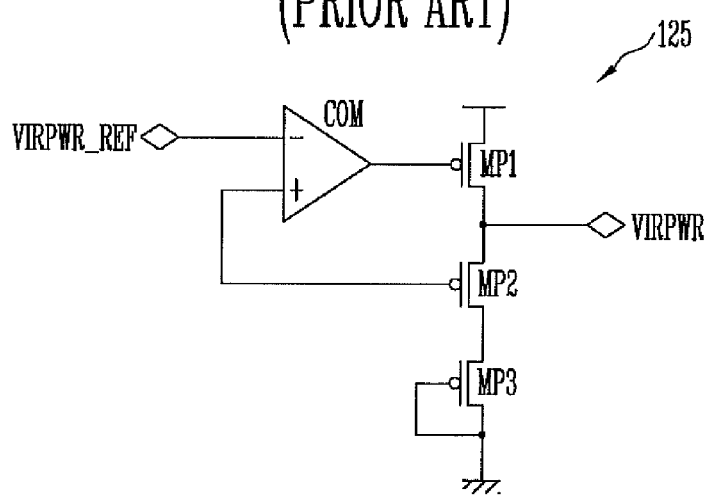
FIG. 1B is a circuit diagram of a variable voltage generator for supplying the variable voltage shown in FIG. 1A.
Figure 2A:
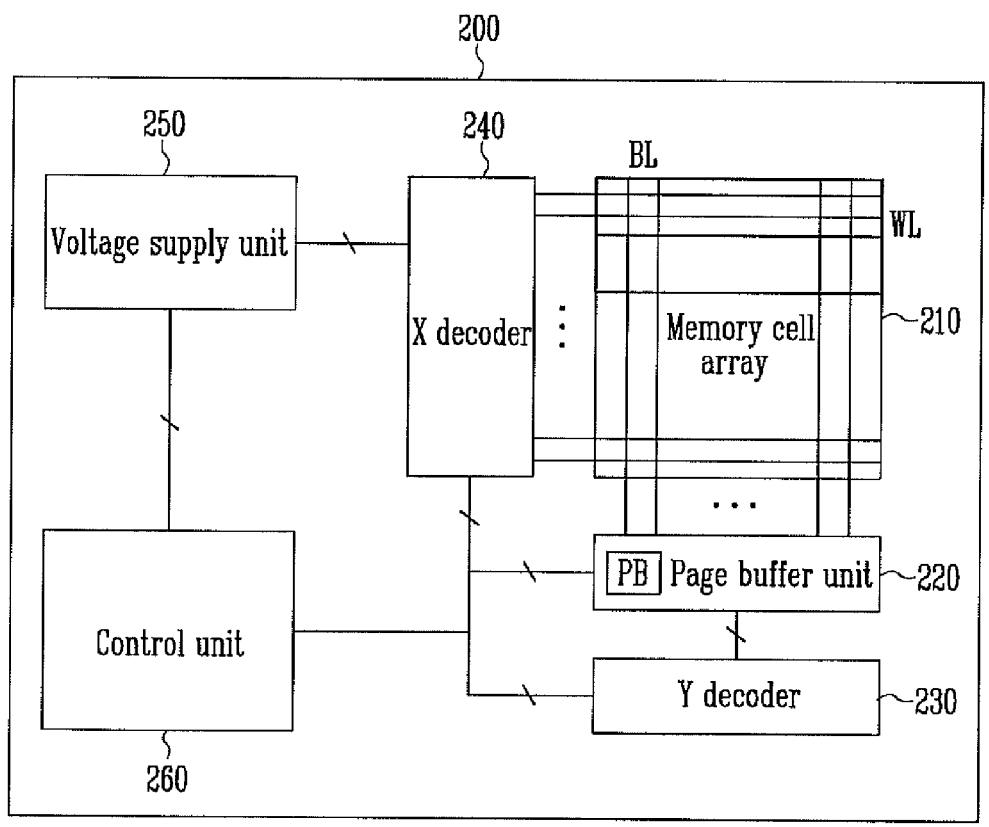
FIG. 2A is a block diagram showing a nonvolatile memory device according to an embodiment of this disclosure.

FIG. 2A is a block diagram showing a nonvolatile memory device according to an embodiment of this disclosure.

Referring to FIG. 2A, the nonvolatile memory device 200 includes a memory cell array 210, a page buffer unit 220, a Y decoder 230, an X decoder 240, a voltage supply unit 250, and a control unit 260.

The memory cell array 210 includes a plurality of memory cells for storing data. The memory cells of the memory cell array 210 are classified into several memory blocks. The memory cells are coupled to bit lines BL and word lines WL.

The page buffer unit 220 includes page buffers PB.

Each of the page buffers PB is coupled to a pair of bit lines BL, including an even bit line BLe and an odd bit line BLo. The page buffer PB includes a number of latch units for storing program data that is to be programmed and storing read data that is obtained by reading data stored in a selected memory cell.

The Y decoder 230 provides the page buffers PB with a data IO path. The X decoder 240 enables a selected memory block and couples the word lines of the enabled memory block and global lines to which operating voltages are supplied.

The voltage supply unit 250 generates and supplies the operating voltages to the global lines. The control unit 260 controls program, read, and erase operations in response to a command.

In the embodiment of this disclosure, when the page buffer PB performs a program operation, a latch unit stepwise discharges a precharged bit line in response to a state of program data.

Figure 2B:
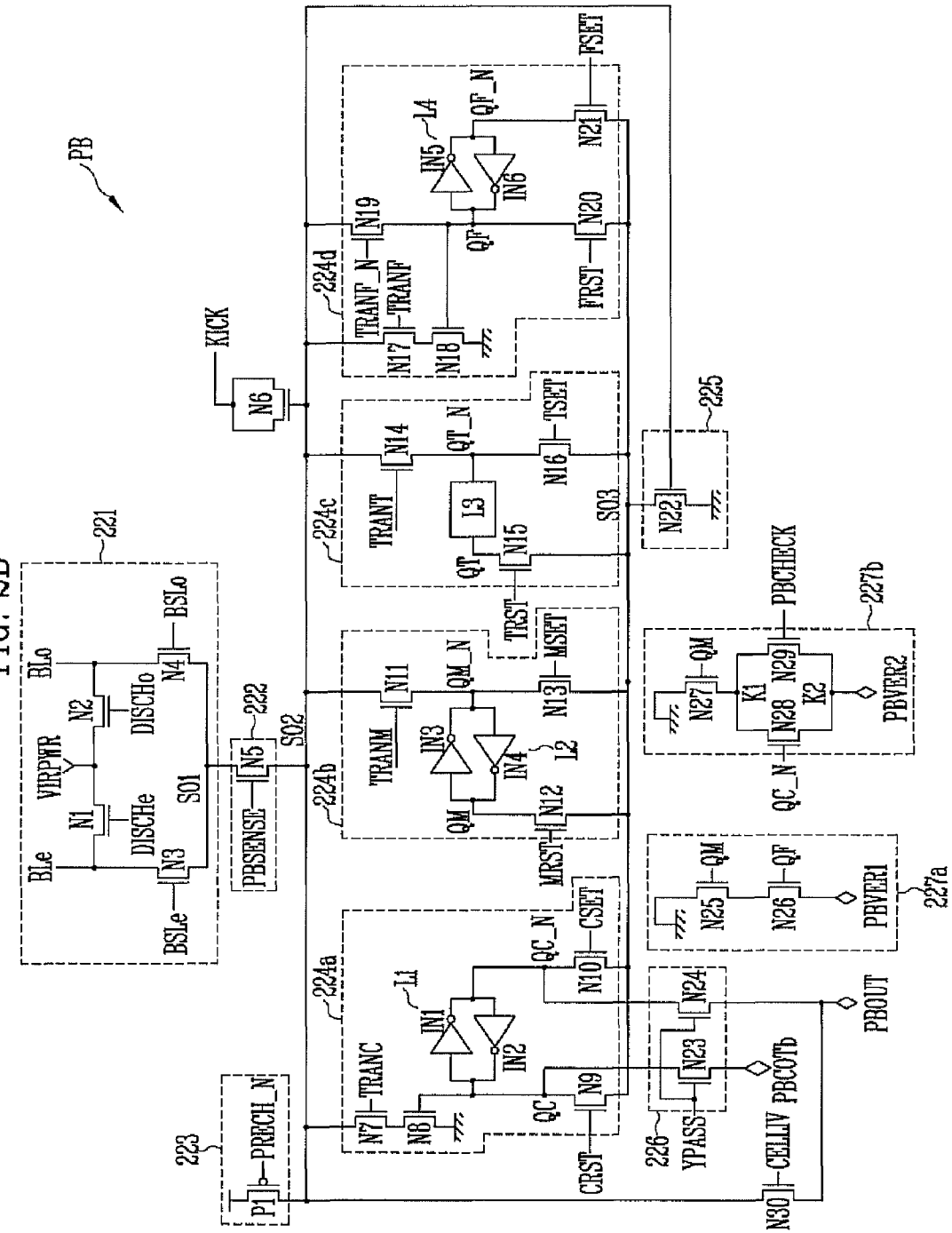
FIG. 2B is a circuit diagram showing a page buffer shown in FIG. 2A.

FIG. 2B shows the page buffer shown in FIG. 2A.

Referring to FIG. 2B, the page buffer PB according to an embodiment of this disclosure includes a bit line selection unit 221, a first sense unit 222, a precharge unit 223, first to fourth latch units 224a to 224d, a second sense unit 225, a data output unit 226, and first and second verification units 227a, 227b.

The bit line selection unit 221 selects one of the even bit line BLe and the odd bit line BLo, and couples a selected bit line to a first sense node SO1 or supplies a variable voltage VIRPWR to the selected bit line.

The first sense unit 222 senses a voltage level of the first sense node SO1 and changes a voltage level of a second sense node SO2. In alternative embodiments, the first sense unit 222 may be omitted, and the bit line selection unit 221 may perform the function of the first sense unit 222. The precharge unit 223 precharges the second sense node SO2.

The first to fourth latch units 224a to 224d respectively include first to fourth latches L1 to L4 for storing data to be programmed or read. The third latch L3 functions to supply the second sense node SO2 with program data. In particular, in the case in which the program data are transferred to the second sense node SO2, the third latch L3 discharges a corresponding bit line to a voltage level higher than a certain voltage level.

In general, the first latch unit 224a is configured to store cache program data or output read data. The second latch unit 224b (i.e., a main latch) is configured to store program data and transfer the program data to the second sense node SO2. The third latch unit 224c is used as a temporary latch, and the fourth latch unit 224d is used as a flag latch.

In the embodiment of this disclosure, however, where a program operation is performed on the third latch unit 224c, the third latch unit 224c is used to discharge a selected bit line to a certain voltage level Vm (e.g., a set voltage).

In other words, the selected bit line is precharged before the program operation and is then discharged to the certain voltage level Vm using the third latch unit 224c. Next, a voltage level of the selected bit line is fully discharged or retained in response to a state of program data stored in the second latch unit 224b.

The second sense unit 225 couples the ground node Vss and the node of a selected latch in response to a voltage level of the second sense node SO2 so that data can be latched in the selected latch. The data output unit 226 is coupled to the first latch unit 224a and configured to output data stored in the first latch unit 224a.

The first and second verification units 227a, 227b are coupled between the first to fourth latch units 224a to 224d, and configured to output respective verification signals through first and second verification signal output terminals PBVER1, PBVER2 for a program verification operation.

The page buffer PB is described in more detail below.

The bit line selection unit 221 includes first to fourth NMOS transistors N1 to N4. The first sense unit 222 includes a fifth NMOS transistor N5. The precharge unit 223 includes a first PMOS transistor P1.

The first to fourth latch units 224a to 224d include the first to fourth latches L1 to L4, respectively, and seventh to twenty-first NMOS transistors N7 to N21. The second sense unit 225 includes a twenty-second NMOS transistor N22.

The data I/O unit 226 includes twenty-third and twenty-fourth NMOS transistors N23, N24. The first and second verification units 227a, 227b include twenty-fifth to twenty-ninth NMOS transistors N25 to N29. The page buffer PB further includes a sixth NMOS transistor N6 and a thirtieth NMOS transistor N30.

The first and second NMOS transistors N1, N2 are coupled in series between the even bit line BLe and the odd bit line BLo. An even discharge control signal DISCHe and an odd discharge control signal DISCHo are respectively inputted to the gates of the first and second NMOS transistors N1, N2.

The variable voltage VIRPWR is supplied to the shared node of the first and second NMOS transistors N1, N2. The variable voltage VIRPWR is supplied by a variable voltage generator (not shown). When a program operation is started, the variable voltage generator supplies a selected bit line with the variable voltage VIRPWR of a precharge voltage (Vdc) level. The variable voltage generator recovers a voltage drop of an unselected bit line when the unselected bit line has a voltage level lower than the precharge voltage (Vdc) level.

The third NMOS transistor N3 is coupled between the even bit line BLe and the first sense node SO1. The fourth NMOS transistor N4 is coupled between the odd bit line BLo and the first sense node SO1. An even bit line selection signal BSLe is inputted to the gate of the third NMOS transistor N3, and an odd bit line selection signal BSLo is inputted to the gate of the fourth NMOS transistor N4.

The fifth NMOS transistor N5 is coupled between the first sense node SO1 and the second sense node SO2. A sense control signal PBSENSE is inputted to the gate of the fifth NMOS transistor N5.

The sixth NMOS transistor N6 is configured to retain a high voltage level of the second sense node SO2 that has been precharged. Further, the sixth NMOS transistor N6 is configured to control a voltage level of the second sense node SO2 in response to a control signal KICK so that the voltage level of the second sense node SO2 is raised or lowered.

The first PMOS transistor P1 is coupled between a power source voltage terminal and the second sense node SO2. A precharge control signal PRECH_N is inputted to the gate of the first PMOS transistor P1.

The seventh and eighth NMOS transistors N7, N8 are coupled between the second sense node SO2 and the ground node Vss. A first data transfer signal TRANC is inputted to the gate of the seventh NMOS transistor N7. A node QC is coupled to the gate of the eighth NMOS transistor N8.

The first latch L1 is configured to include first and second inverters IN1, IN2 and coupled between the node QC and a node QC_N.

The ninth NMOS transistor N9 is coupled between the node QC and a third sense node SO3. The tenth NMOS transistor N10 is coupled between the node QC_N and the third sense node SO3. A first reset signal CRST is inputted to the gate of the ninth NMOS transistor N9. A first set signal CSET is inputted to the gate of the tenth NMOS transistor N10.

The eleventh NMOS transistor N11 is coupled between the second sense node SO2 and a node QM_N. A second data transfer signal TRANM is inputted to the gate of the eleventh NMOS transistor N11.

The second latch L2 is configured to include third and fourth inverters IN3, IN4 and coupled between a node QM and the node QM_N.

The twelfth NMOS transistor N12 is coupled between the node QM and the third sense node SO3. The thirteenth NMOS transistor N13 is coupled between the node QM_N and the third sense node SO3. A second reset signal MRST is inputted to the gate of the twelfth NMOS transistor N12. A second set signal MSET is inputted to the gate of the thirteenth NMOS transistor N13.

The fourteenth NMOS transistor N14 is coupled between the second sense node SO2 and a node QT_N. A third data transfer signal TRANT is inputted to the gate of the fourteenth NMOS transistor N14.

The third latch L3 includes a circuit different from the first, second, and fourth latches. The circuit is described in more detail with reference to FIG. 2C. The third latch L3 is coupled between a node QT and the node QT_N.

The fifteenth NMOS transistor N15 is coupled between the node QT and the third sense node SO3. The sixteenth NMOS transistor N16 is coupled between the node QT_N and the third sense node SO3. A third reset signal TRST is inputted to the gate of the fifteenth NMOS transistor N15. A third set signal TSET is inputted to the gate of the sixteenth NMOS transistor N16.

The seventeenth and eighteenth NMOS transistors N17, N18 are coupled in series between the second sense node SO2 and the ground node Vss. A fourth data transfer signal TRANF is inputted to the gate of the seventeenth NMOS transistor N17. The gate of the eighteenth NMOS transistor N18 is coupled to a node QF.

The nineteenth NMOS transistor N19 is coupled between the second sense node SO2 and the node QF. A fifth data transfer signal TRANF_N (i.e., an inverted signal of the fourth data transfer signal TRANF) is inputted to the gate of the nineteenth NMOS transistor N19.

The fourth latch L4 is configured to include fifth and sixth inverters IN5, IN6 and coupled between the node QF and a node QF_N.

The twentieth NMOS transistor N20 is coupled between the node QF and the third sense node SO3. The twenty-first NMOS transistor N21 is coupled between the node QF_N and the third sense node SO3. A fourth reset signal FRST is inputted to the gate of the twentieth NMOS transistor N20. A fourth set signal FSET is inputted to the gate of the twenty-first NMOS transistor N21.

The twenty-second NMOS transistor N22 is coupled between the third sense node SO3 and the ground node Vss. The gate of the twenty-second NMOS transistor N22 is coupled to the second sense node SO2.

The twenty-third NMOS transistor N23 is coupled between the node QC and a first data output terminal PBOUTb. The twenty-fourth NMOS transistor N24 is coupled between the node QC_N and a second data output terminal PBOUT. A Y pass signal YPASS is inputted to the twenty-third and twenty-fourth NMOS transistors N23, N24. The data output unit 226, including the twenty-third and twenty-fourth NMOS transistors N23, N24, may be included in the Y decoder 230, if needed.

The twenty-fifth and twenty-sixth NMOS transistors N25, N26 are coupled in series between the ground node Vss and the first verification signal output terminal PBVER1. The node QM is coupled to the gate of the twenty-fifth NMOS transistor N25. The node QF is coupled to the gate of the twenty-sixth NMOS transistor N26.

The twenty-seventh NMOS transistor N27 is coupled between a node K1 and the ground node Vss. The node QM is coupled to the gate of the twenty-seventh NMOS transistor N27.

The twenty-eighth and twenty-ninth NMOS transistors N28, N29 are coupled in parallel to the node K1 and a node K2. The node K2 is coupled to the second verification signal output terminal PBVER2. The node QC_N is coupled to the gate of the twenty-eighth NMOS transistor N28. A check signal PBCHECK is inputted to the gate of the twenty-ninth NMOS transistor N29.

The thirtieth NMOS transistor N30 is coupled between the second sense node SO2 and the second data output terminal PBOUT. A control signal CELLIV is inputted to the gate of the thirtieth NMOS transistor N30.

The construction of the third latch L3 is described in more detail below.

Figure 2C:
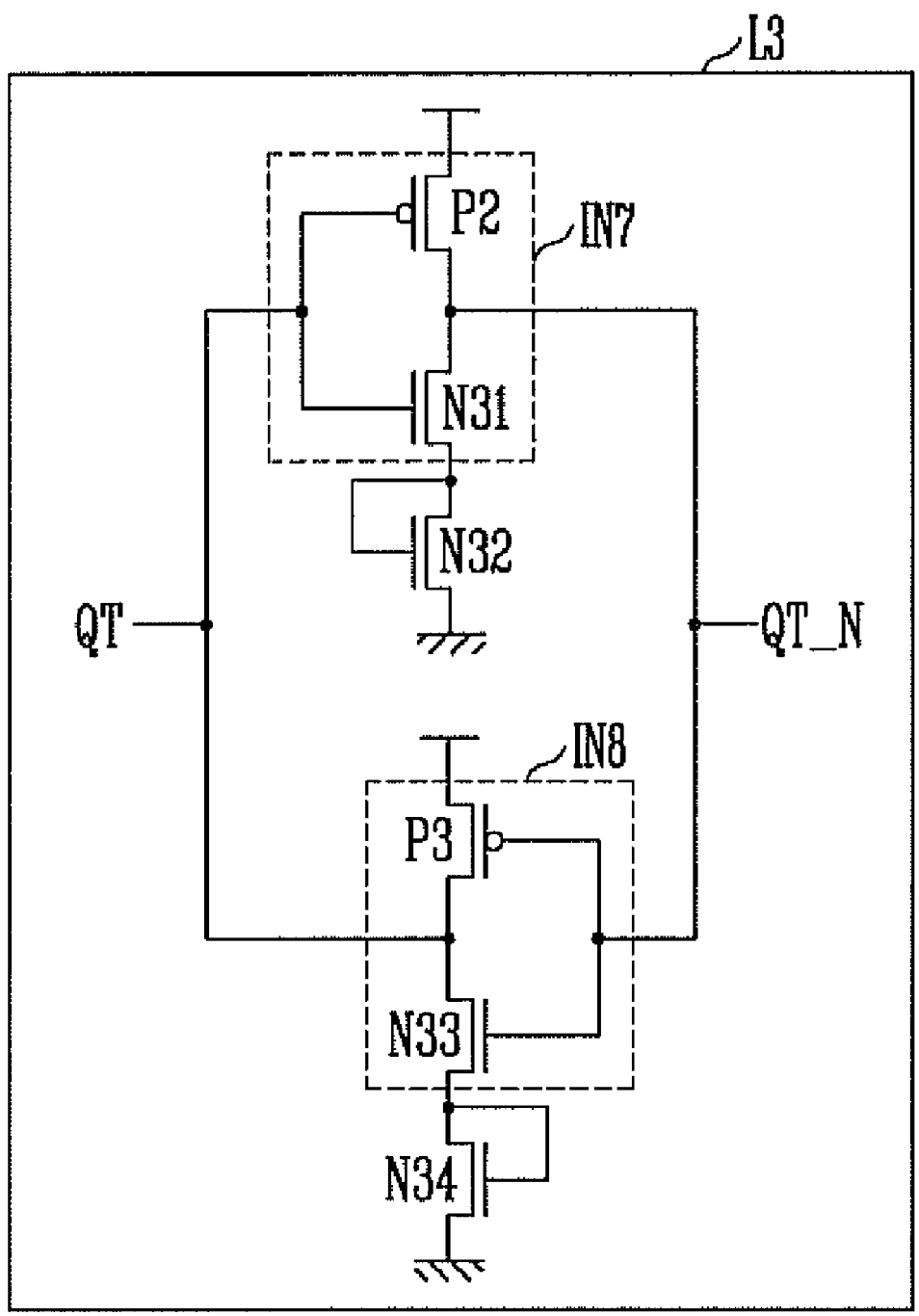
FIG. 2C is a circuit diagram showing a third latch shown in FIG. 2B.

FIG. 2C illustrates the third latch L3 shown in FIG. 2B.

Referring to FIG. 2C, the third latch L3 includes second and third PMOS transistors P2, P3 and thirty-first to thirty-fourth NMOS transistors N31 to N34.

The second PMOS transistor P2 and the thirty-first and thirty-second NMOS transistors N31, N32 are coupled in series between a power source voltage Vcc and the ground node Vss. The third PMOS transistor P3 and the thirty-third and thirty-fourth NMOS transistors N33, N34 are coupled in series between the power source voltage Vcc and the ground node.

The gates of the second PMOS transistor P2 and the thirty-first NMOS transistor N31 are coupled to the node QT. The gates of the third PMOS transistor P3 and the thirty-third NMOS transistor N33 are coupled to the node QT_N. Further, the node QT is coupled to a source/drain terminal shared by the third PMOS transistor P3 and the thirty-third NMOS transistor N33. Similarly, the node QT_N is coupled to a source/drain terminal shared by the second PMOS transistor and the thirty-first NMOS transistor N31.

The thirty-second and thirty-fourth NMOS transistors N32, N34 are each diode-interconnected.

The second PMOS transistor P2 and the thirty-first NMOS transistor N31 constitute a seventh inverter IN7 The third PMOS transistor P3 and the thirty-third NMOS transistor N33 constitute an eighth inverter IN8.

In the third latch L3 as constructed above, when the node QT is in a high logic level, the node QT_N becomes a low logic level. The low logic level of the node QT_N differs from a low logic level of the first, second, and fourth latches L1, L2, and L4 shown in FIG. 2B.

In other words, when the first, second, and fourth latches L1, L2, and L4 shown in FIG. 2B have a low logic level, they have a voltage level close to 0 V because they are coupled to the ground node. However, the third latch L3 shown in FIG. 2C has a low voltage level that has risen by a threshold voltage Vt of the diode because of the thirty-second and thirty-fourth NMOS transistors N32, N34 which are each diode-interconnected.

In another embodiment, the thirty-second NMOS transistor N32 or the thirty-fourth NMOS transistor N34 may be replaced with a resistor element.

A process of precharging and discharging a bit line in the page buffer PB shown in FIG. 2B is described below.

Figure 3:
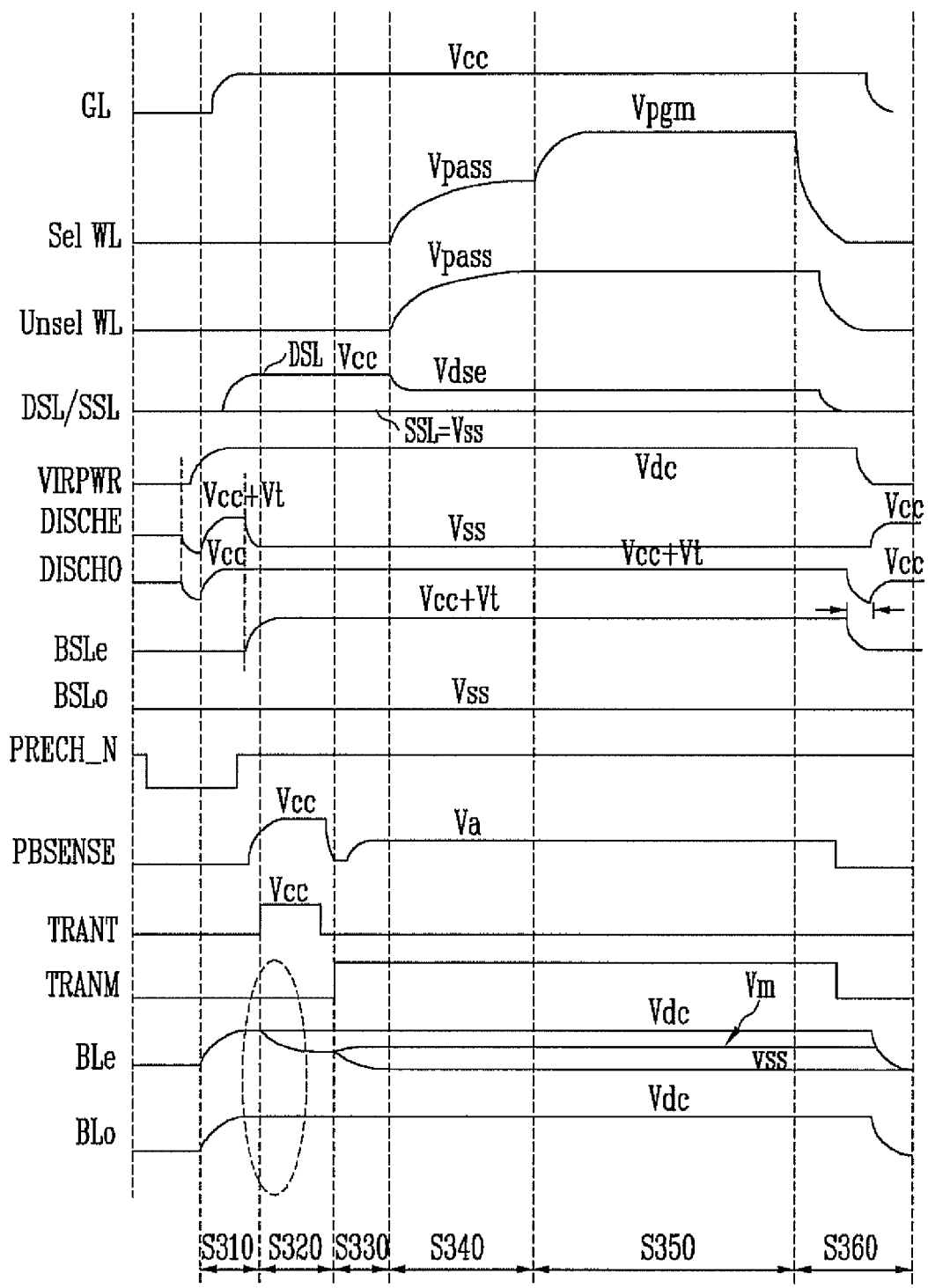
FIG. 3 is a timing diagram illustrating a shift in a bit line voltage in a program operation according to an embodiment of this disclosure.

FIG. 3 is a timing diagram illustrating a shift in a bit line voltage as a result of a program operation according to an embodiment of this disclosure.

Referring to FIG. 3, before a program operation is started, the variable voltage VIRPWR of a precharge voltage (Vdc) level is supplied. The even bit line BLe and the odd bit line BLo are precharged to the precharge voltage (Vdc) level in response to the even and odd discharge control signals DISCHe, DISCHo of a high logic level, respectively, at step S310.

Herein, with respect to the exemplary embodiment of FIG. 3, it is assumed that the even bit line BLe is selected. To perform the program operation, where the selected bit line is the even bit line BLe, the even discharge control signal DISCHe shifts to a low logic level so that the variable voltage VIRPWR is no longer supplied to the even bit line BLe.

Further, the third NMOS transistor N3 is turned on in response to the even bit line selection signal BSLe of a high logic level. The fifth NMOS transistor N5 is turned on in response to the sense control signal PBSENSE of a high logic level.

Accordingly, the even bit line BLe is coupled to the second sense node SO2, and so the second sense node SO2 is precharged to a high voltage level.

In the state in which the node QT_N of the third latch L3 is reset to a low voltage level, the fourteenth NMOS transistor N14 is turned on in response to the third data transfer signal TRANT of a high logic level, and so the second sense node SO2 has a low voltage level. As described above with reference to FIG. 2C, the node QT_N may be in a low logic level state, although its voltage level may be as much as a threshold voltage of the diode at step S320.

Accordingly, the even bit line BLe is discharged to a certain voltage level Vm in response to a voltage level of the second sense node SO2. The certain voltage level Vm is a voltage level which makes a corresponding cell string self-boosted when a program operation is performed. In the embodiment of this disclosure, the even bit line BLe drops to a voltage level of a threshold voltage of the diode from the precharge voltage Vdc.

The fourteenth NMOS transistor N14 is turned off in response to the third data transfer signal TRANT of a low logic level. The voltage level of the even bit line BLe is changed in response to a state of program data stored in the second latch L2 (i.e., the main latch) at step S330. To this end, the eleventh NMOS transistor N11 is turned on in response to the second data transfer signal TRANM of a high logic level.

If program data having a state '0' are stored in the node QM_N of the second latch L2, the even bit line BLe is discharged to a ground voltage Vss. If program data having a state '1' are stored in the node QM_N of the second latch L2, the even bit line BLe is maintained at the certain voltage level Vm.

When the even bit line BLe is discharged to the ground voltage Vss, the even bit line BLe has already been discharged to the certain voltage level Vm. Accordingly, when a recovery operation is performed on the odd bit line BLo (i.e., the unselected bit line) because of a coupling effect, a peak current is reduced as compared with a peak current in the case in which the even bit line BLe is discharged from the precharge voltage Vdc.

A subsequent program operation is similar to a known program operation.

The above method of discharging a bit line can be applied to a shielded bit line (BL) structure, such as that in which an even bit line is selected from a pair of the even bit line and an odd bit line, and the odd bit line is not selected.

That is, if the above method is applied to a case in which an even bit line and an odd bit line are precharged and only one of the even and odd bit lines is selected and discharged, a peak current, occurring when a recovery operation is performed in order to make the other of the even and odd bit lines maintain a precharge voltage, can be reduced.

Meanwhile, in the case in which the third latch L3 is configured as in FIG. 2C, problems may occur when a program verification operation is performed.

Figure 4:
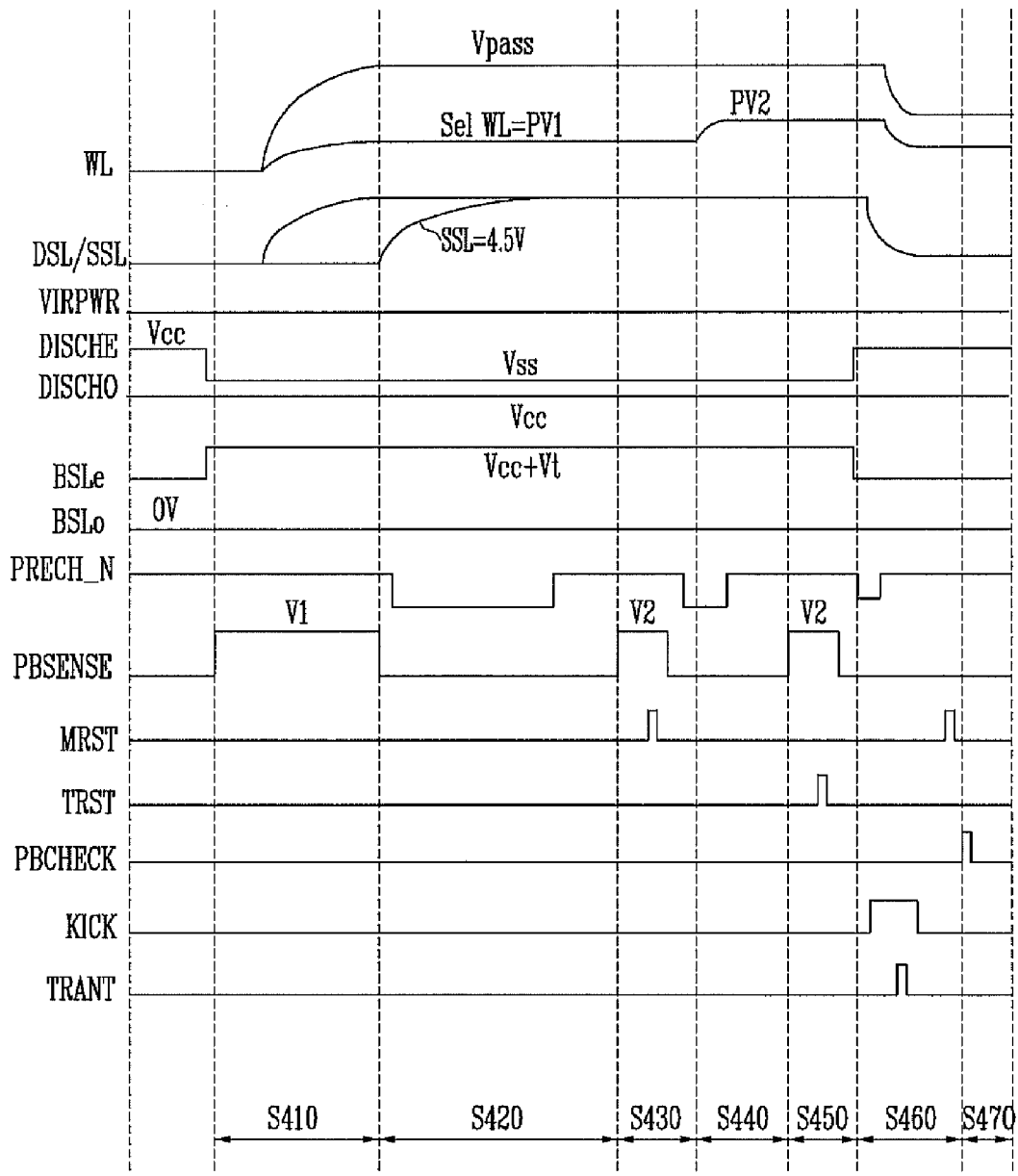
FIG. 4 is a timing diagram illustrating a program verification process according to another embodiment of this disclosure.

FIG. 4 is a timing diagram illustrating a program verification process according to another embodiment of this disclosure.

In a known program verification operation, verification data obtained using a first verification voltage PV1 are stored in the third latch L3, and verification data obtained using a second verification voltage PV2 are stored in the second latch L2. In the page buffer PB according to the embodiment of this disclosure, however, as shown in FIG. 4, verification data obtained using the first verification voltage PV1 are stored in the second latch L2, and verification data obtained using the second verification voltage PV2 are stored in the third latch L3 at steps S410 to S450.

As described above, only the sequence of storing data in the second latch L2 and the third latch L3 in the existing verification operation is changed. In such an operation, however, a problem arises because a program verification operation in the second latch L2 has to be checked.

To prevent this problem, there is a need for a process of transferring the verification data, stored in the third latch L3, to the second latch L2. However, as described above, when program data stored in the node QT_N have a state '1', the second sense node SO2 can have the power source voltage (Vcc) level. When program data stored in the node QT_N have a state '0', the second sense node SO2 has the certain voltage (Vm) level.

In the case in which the verification data stored in the third latch L3 are transferred to the second latch L2, a voltage level of the second sense node SO2 is changed in response to a state of the program data stored in the node QT_N, and the verification data are then stored in the second latch L2 in response to the second reset signal MRST of a high logic level.

In this case, there is no problem when the second sense node SO2 has the power source voltage (Vcc) level because the twenty-second NMOS transistor N22 is certainly turned on. In the case in which the second sense node SO2 has the certain voltage (Vm) level, however, the twenty-second NMOS transistor N22 may be turned on even though it must remain turned off.

To prevent this problem, in the state in which the second sense node SO2 is precharged, when a voltage level of the second sense node SO2 is changed in response to a state of program data stored in the node QT_N of the third latch L3, the voltage level of the second sense node SO2 is changed while the control signal KICK remains at a high voltage level. Next, the control signal KICK shifts to a low voltage level so that a voltage drop is generated in the second sense node SO2 because of a coupling effect at step S460.

Here, the voltage drop is of a level such that the twenty-second NMOS transistor N22 can be turned on although a voltage drop of the second sense node SO2 is generated when the second sense node SO2 has the power source voltage (Vcc) level, and that the twenty-second NMOS transistor N22 can be turned off if a voltage drop of the second sense node SO2 is generated when the second sense node SO2 has the certain voltage (Vm) level.

Accordingly, if a state of the program data stored in the second latch L2 is changed in response to the second reset signal MRST, the verification data stored in the third latch L3 can be safely transferred to the second latch L2 at step S460. Next, a program verification operation is performed according to a known verification process at step S470.

As described above, the verification data stored in the third latch L3 can be normally transferred to the second latch L2 using the control signal KICK.

In accordance with the page buffer circuit, the nonvolatile memory device including the page buffer circuit, and the method of operating the nonvolatile memory device of the present disclosure, where a voltage level of a selected bit line is changed, the selected bit line is stepwise discharged from a precharge state in response to a state of program data. Accordingly, a peak current can be reduced because a voltage level of an unselected bit line does not drop sharply.

What is claimed is:

1. A page buffer circuit, comprising:
 a bit line selection unit coupled to first and second bit lines, and configured to select the first or second bit line in response to a first control signal and to couple the selected bit line to a sense node, or to selectively precharge the first and second bit lines to a first voltage level or discharge the first and second bit lines to a ground voltage level;
 a first latch unit configured to store program data and change a voltage level of the sense node according to the stored program data;
 a second latch unit configured to store data of a low logic level in response to a reset signal and discharge a selected bit line from a precharge state with the first voltage level to a second voltage level higher than the ground voltage level; and
 a voltage control element configured to raise a voltage level of the sense node or drop the voltage level of the sense node to a third voltage level lower than the second voltage level in response to a second control signal.

2. The page buffer circuit of claim 1, wherein the data stored in the second latch unit have a voltage level equal to the second voltage level, which is higher than the ground voltage level.

3. The page buffer circuit of claim 1, wherein:
 the voltage control element comprises a transistor having a gate coupled to the sense node and a drain and a source interconnected, and
 the second control signal is inputted to the transistor.

4. The page buffer circuit of claim 1, wherein the second latch unit comprises:
 a first inverter configured to invert a signal of a first node and output an inverted signal to a second node;
 a first element configured to raise an output of the first inverter to a certain voltage level when the output of the first inverter is in a low logic level state;
 a second inverter configured to invert a signal of the second node and output an inverted signal to the first node; and
 a second element configured to raise an output of the second inverter to a constant voltage level when the output of the second inverter is in a low logic level state.

5. The page buffer circuit of claim 4, wherein each of the first and second elements comprises a diode.

6. The page buffer circuit of claim 4, wherein each of the first and second elements comprises a resistor.

7. The page buffer circuit of claim 1, wherein in a case in which the data stored in the second latch unit are transferred to the first latch unit, the sense node is precharged so that a voltage level of the sense node is changed in response to a state of the data stored in the second latch unit, the voltage level of the sense node is changed using the voltage control element, and the data stored in the second latch unit are stored in the first latch unit.

8. The page buffer circuit of claim 7, wherein in the case in which the data stored in the second latch unit are transferred to the first latch unit, the voltage control element drops the voltage level of the sense node to the third voltage level.

9. A nonvolatile memory device, comprising:
 a memory cell array configured to comprise memory blocks each comprising memory cells coupled to bit lines and word lines; and
 a page buffer unit coupled to the bit lines and configured to comprise page buffers each comprising a first latch and a second latch, wherein the first latch latches program data to be programmed into a memory cell or stores read data read from a memory cell, and the second latch discharges a precharged bit line with a first voltage level to a second voltage level higher than a ground voltage level, when data stored in the second latch have a low logic level state.

10. The nonvolatile memory device of claim 9, wherein each of the page buffers further comprises:
 a bit line selection unit coupled to first and second bit lines from among the bit lines of the memory cell array, and configured to select the first or second bit line in response to a first control signal and to couple the selected bit line to a sense node, or to selectively precharge the first and second bit lines to the first voltage level or discharge the first and second bit lines to the ground voltage level using a variable voltage;

a first latch configured to store the program data and to change a voltage level of the sense node according to the stored program data;

a second latch configured to discharge the selected bit line from a precharged state with the first voltage level to the second voltage level; and a voltage control element configured to raise a voltage level of the sense node or drop the voltage level of the sense node to a third voltage level lower than the second voltage level in response to a second control signal.

11. The nonvolatile memory device of claim 10, wherein the data stored in the second latch have a voltage level equal to the second voltage level, which is higher than the ground voltage level.

12. The nonvolatile memory device of claim 10, wherein:
the voltage control element comprises a transistor having a gate coupled to the sense node and a drain and a source interconnected, and
the second control signal is inputted to the transistor.

13. The nonvolatile memory device of claim 10, wherein the second latch comprises:
a first inverter configured to invert a signal of a first node and output an inverted signal to a second node;
a first element configured to raise an output of the first inverter to a certain voltage level when the output of the first inverter is in a low logic level state;
a second inverter configured to invert a signal of the second node and output an inverted signal to the first node; and
a second element configured to raise an output of the second inverter to a constant voltage level when the output of the second inverter is in a low logic level state.

14. The nonvolatile memory device of claim 13, wherein each of the first and second elements comprises a diode.

15. The nonvolatile memory device of claim 13, wherein each of the first and second elements comprises a resistor.

16. The nonvolatile memory device of claim 10, wherein in a case in which the data stored in the second latch are transferred to the first latch, the sense node is precharged so that a voltage level of the sense node is changed in response to a state of the data stored in the second latch, the voltage level of the sense node is changed using the voltage control element, and the data stored in the second latch are stored in the first latch.

17. The nonvolatile memory device of claim 16, wherein in a case in which the data stored in the second latch are transferred to the first latch, the voltage control element drops the voltage level of the sense node to the third voltage level.

18. A method of operating a nonvolatile memory device, including a page buffer coupled to first and second bit lines and configured to comprise first and second latches, wherein the first latch is coupled to a sense node and is configured to store program data and the second latch is coupled to the sense node and is configured to discharge a precharged bit line with a first voltage level to a second voltage level, when data stored in the second latch have a low logic level state, the method comprising:
selecting one of the first and second bit lines;
precharging the selected bit line to the first voltage level;
coupling the selected bit line to the second latch and discharging the selected bit line to a second voltage level higher than a ground voltage level;
discharging the selected bit line to a ground voltage level or maintaining the selected bit line at the second voltage level, in response to a state of data stored in the first latch; and
performing a program operation in response to a program pulse.

19. The method of claim 18, wherein if the selected bit line is maintained at the second voltage level, the program operation for the selected bit line is inhibited.

20. The method of claim 19, further comprising performing a program verification operation after performing the program operation,
wherein in a case in which data stored in the second latch are transferred to the first latch, performing the program verification operation comprises:
precharging the sense node and changing a voltage level of the sense node in response to a state of the data stored in the second latch;
dropping the voltage level of the sense node to a certain voltage level; and
storing data based on the dropped voltage level of the sense node in the first latch.

* * * * *